United States Patent
Tsubosaki et al.

(10) Patent No.: US 6,335,227 B1
(45) Date of Patent: Jan. 1, 2002

(54) METHOD OF FABRICATING A LEAD-ON-CHIP (LOC) SEMICONDUCTOR DEVICE

(76) Inventors: Kunihiro Tsubosaki, 2-29-22, Higashihirayama, Hino-shi, Tokyo; Masachika Masuda, 620-15, Kitaiwaoka, Tokorozawa-shi, Saitama; Akihiko Iwaya, 3-16-8, Minamiogikubo, Suginami-ku, Tokyo; Atsushi Nakamura, 3-27-52, Musashidai, Fuchu-shi, Tokyo; Chikako Imura, 2-839-4-307, Chuo, Higashiyamato-shi, Tokyo; Toshihiro Shiotsuki, 3-4-25, Nukuiminami-cho, Koganei-shi, Tokyo, all of (JP)

(*) Notice: Subject to any disclaimer, the term of this patent is extended or adjusted under 35 U.S.C. 154(b) by 0 days.

(21) Appl. No.: 09/690,451

(22) Filed: Oct. 18, 2000

Related U.S. Application Data

(62) Division of application No. 09/258,300, filed on Feb. 26, 1999, now Pat. No. 6,137,159.

(30) Foreign Application Priority Data

Feb. 27, 1998 (JP) .............................................. 10-48218

(51) Int. Cl.$^7$ ................................................ H01L 21/44
(52) U.S. Cl. ........................ 438/123; 438/111; 438/112; 438/121
(58) Field of Search ................................ 438/111, 112, 438/121, 123, 124, 125, 126, 127

(56) References Cited

U.S. PATENT DOCUMENTS

| | | | |
|---|---|---|---|
| 5,229,329 A | * 7/1993 | Chai et al. | 438/123 |
| 5,780,923 A | * 7/1998 | Courtenay | 438/123 |
| 5,821,605 A |   10/1998 | Hong et al. | 257/668 |
| 5,907,769 A | * 5/1999 | Corisis | 438/123 |
| 6,008,073 A | * 12/1999 | King et al. | 438/123 |
| 6,066,515 A | * 5/2000 | Schoenfeld | 438/123 |

FOREIGN PATENT DOCUMENTS

JP          2-246125          10/1990

* cited by examiner

*Primary Examiner*—Kevin M. Picardat

(57) ABSTRACT

A method is provided for forming a thin, inexpensive, high-performance semiconductor device provided with busbar leads, power leads and signal leads. A portion of the power lead connected to the busbar lead is depressed toward a major surface of a semiconductor chip to form a depressed portion, and the depressed portion is bonded to the major surface of the semiconductor chip by an adhesive layer. The signal lead and the busbar lead are spaced apart from the major surface of the semiconductor chip.

8 Claims, 18 Drawing Sheets

METHOD OF FABRICATING A LEAD-ON-CHIP (LOC) SEMICONDUCTOR DEVICE

This application is a Divisional application of U.S. application Ser. No. 09/258,300, filed Feb. 26, 1999, now U.S. Pat. No. 6,137,159.

BACKGROUND OF THE INVENTION

The present invention relates to a semiconductor device and a method of fabricating the same. More particularly, the present invention relates to techniques effectively applicable to a lead-on-chip (LOC) semiconductor device.

The LOC package is one of surface-mount LSI packages. In the LOC package, inner lead parts of leads are arranged on an insulating film formed on a major surface of a semiconductor chip, and the inner lead parts are connected electrically to the bonding pads of the semiconductor chip with Au wires. The insulating film is formed of a heat-resistant resin, such as a polyimide resin. The opposite surfaces are coated with an adhesive.

A LOC package of this kind is disclosed in Japanese Patent Laid-Open No. Hei 2-246125.

SUMMARY OF THE INVENTION

The foregoing LOC package has the insulating film of a thickness on the order of 50 $\mu$m interposed between the semiconductor chip and the inner lead parts. This insulating film is an obstacle to fabricating a very thin package of a thickness on the order of 1 mm. Furthermore, the insulating film is costly and requires work for applying the same to a lead frame, which increases the manufacturing costs of the package.

Furthermore, the insulating film has a hygroscopic property higher than that of a resin forming the package. Therefore, it is possible that the package is cracked by steam produced by the sudden evaporation and expansion of moisture absorbed by the insulating film caused by heat applied to the package during temperature cycling tests or heat applied to the package when soldering the package to a printed wiring board.

Accordingly, it is a first object of the present invention to provide techniques capable of fabricating thin LOC packages.

A second object of the present invention it to provide techniques capable of fabricating LOC packages at a low manufacturing cost.

A third object of the present invention is to provide techniques capable of improving the reliability of LOC packages and of improving the yield of a LOC package producing line.

Among inventions disclosed in this application, the outline of representative ones will be briefly described as follows.

(1) According to a first aspect of the present invention, a semiconductor package comprises: a semiconductor chip provided with a plurality of bonding pads formed on a major surface thereof; a power lead extended along a direction in which the bonding pads are arranged and having a depressed portion depressed toward the major surface of the semiconductor chip; and a signal lead having an end part lying in a region corresponding to the major surface of the semiconductor chip; wherein the power lead and the signal lead are connected electrically to the bonding pads by a bonding wire, the depressed portion of the power lead is fixed to the major surface of the semiconductor chip by an adhesive layer, and the signal lead is spaced apart from the major surface of the semiconductor chip.

(2) In the semiconductor device stated in (1), the power lead includes a first power lead for applying a supply voltage to the semiconductor chip, and a second power lead for applying a reference voltage to the semiconductor chip, and the first and the second power leads are disposed on the opposite sides of the arrangement of the bonding pads, respectively.

(3) In the semiconductor device stated in (1), the distance between the signal lead and the major surface of the semiconductor chip is greater than the distance between the power lead and the major surface of the semiconductor chip.

(4) In the semiconductor device stated in (1), the depressed portion of the power lead is positioned inside the ends of the semiconductor chip.

(5) In the semiconductor device stated in (1), parts of the power lead and the signal lead corresponding to the end parts of the semiconductor chip are spaced a distance not shorter than 10 $\mu$m apart from the major surface of the semiconductor chip.

(6) In the semiconductor device stated in (1), the adhesive layer is formed of a thermoplastic adhesive.

(7) In the semiconductor device stated in (1), the signal lead is disposed farther from the bonding pads than the power lead, and the bonding wire electrically connecting the signal lead to the bonding pads is extended over the power lead.

(8) In the semiconductor device stated in (1), the power lead have a bend bent in a plane parallel to the major surface of the semiconductor chip, respectively.

(9) In the semiconductor device stated in (1), the major surface of the semiconductor chip is coated with a protective film, and power supply lines electrically connected to the power lead underlie the protective film.

(10) In the semiconductor device stated in (1), an insulating layer for absorbing shocks that may be exerted on the semiconductor chip during a wire bonding operation is formed on the major surface of the semiconductor chip excluding regions in which the bonding pads are formed.

(11) In the semiconductor device stated in (1), the semiconductor chip, the inner lead part of the power lead and the inner lead part of the signal lead are sealed in a resin package, the outer lead part of the power lead and the outer lead part of the signal lead project outside from the resin package.

(12) According to a second aspect of the present invention, a semiconductor device comprises: a semiconductor chip provided with a plurality of bonding pads formed on a major surface thereof; power leads connected extended along a direction in which the bonding pads are arranged, and having depressed portions depressed toward the major surface of the semiconductor chip; and signal leads having end parts lying in a region corresponding to the major surface of the semiconductor chip; wherein the power leads and the signal leads are connected electrically to the bonding pads by bonding wires, respectively, the depressed portions of the power leads are fixed to the major surface of the semiconductor chip by an adhesive layer, and the signal leads are spaced apart from the major surface of the semiconductor chip.

(13) In the semiconductor device stated in (12), the power leads include a first power lead for applying a supply voltage to the semiconductor chip, and a second power lead for applying a reference voltage to the semiconductor chip, and the first and the second power leads are disposed on the opposite sides of the arrangement of the bonding pads, respectively.

(14) In the semiconductor device stated in (12), projections project from parts of the leads extending along the direction in which the bonding pads are arranged in a direction away from the bonding pads, one end of each of the bonding wires electrically connecting the power leads to the bonding pads is bonded to the projection.

(15) In the semiconductor device stated in (12), a branch lead extends near the semiconductor chip from parts of the power leads, one end of each of the bonding wires electrically connecting the power leads to the bonding pads is bonded to the branch lead.

(16) According to a third aspect of the present invention, a semiconductor device comprises: a semiconductor chip provided with a plurality of bonding pads formed on a major surface thereof; a power lead arranged along a direction in which the bonding pads are arranged and having a part fixed to the major surface of the semiconductor chip by an adhesive layer; and a signal lead having a part lying in a region corresponding to the major surface of the semiconductor chip; wherein the power lead and the signal lead are connected electrically to the bonding pads by bonding wire, and the signal lead is spaced apart from the major surface of the semiconductor chip.

(17) In the semiconductor device stated in (16), the adhesive layer is extended in substantially all regions underlying the power lead.

(18) In the semiconductor device stated in (16), the adhesive layer is extended in part of regions underlying the power lead.

(19) In the semiconductor device stated in (16), the adhesive layer is extended in regions underlying bonding parts of the power lead.

(20) According to a fourth aspect of the present invention, a semiconductor device fabricating method comprises the steps of:

(a) forming a lead frame having a power lead extended along a direction in which bonding pads of a semiconductor chip to be supported on one surface thereof are arranged and having depressed portion depressed toward a major surface of the semiconductor chip, and signal lead having an end part to be spaced apart from the major surface of the semiconductor chip;

(b) putting the semiconductor chip on the lead frame with an adhesive layer interposed between the depressed portion of the power lead and the major surface of the semiconductor chip to support the semiconductor chip fixedly on a surface of the lead frame;

(c) electrically connecting the power lead and the signal lead of the lead frame to the bonding pads formed on the major surface of the semiconductor chip by a bonding wire; and (d) sealing the semiconductor chip in a package body.

The semiconductor device according to the present invention is of a multichip module structure formed by vertically stacking a plurality of packages of the foregoing LOC construction on a printed wiring board.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
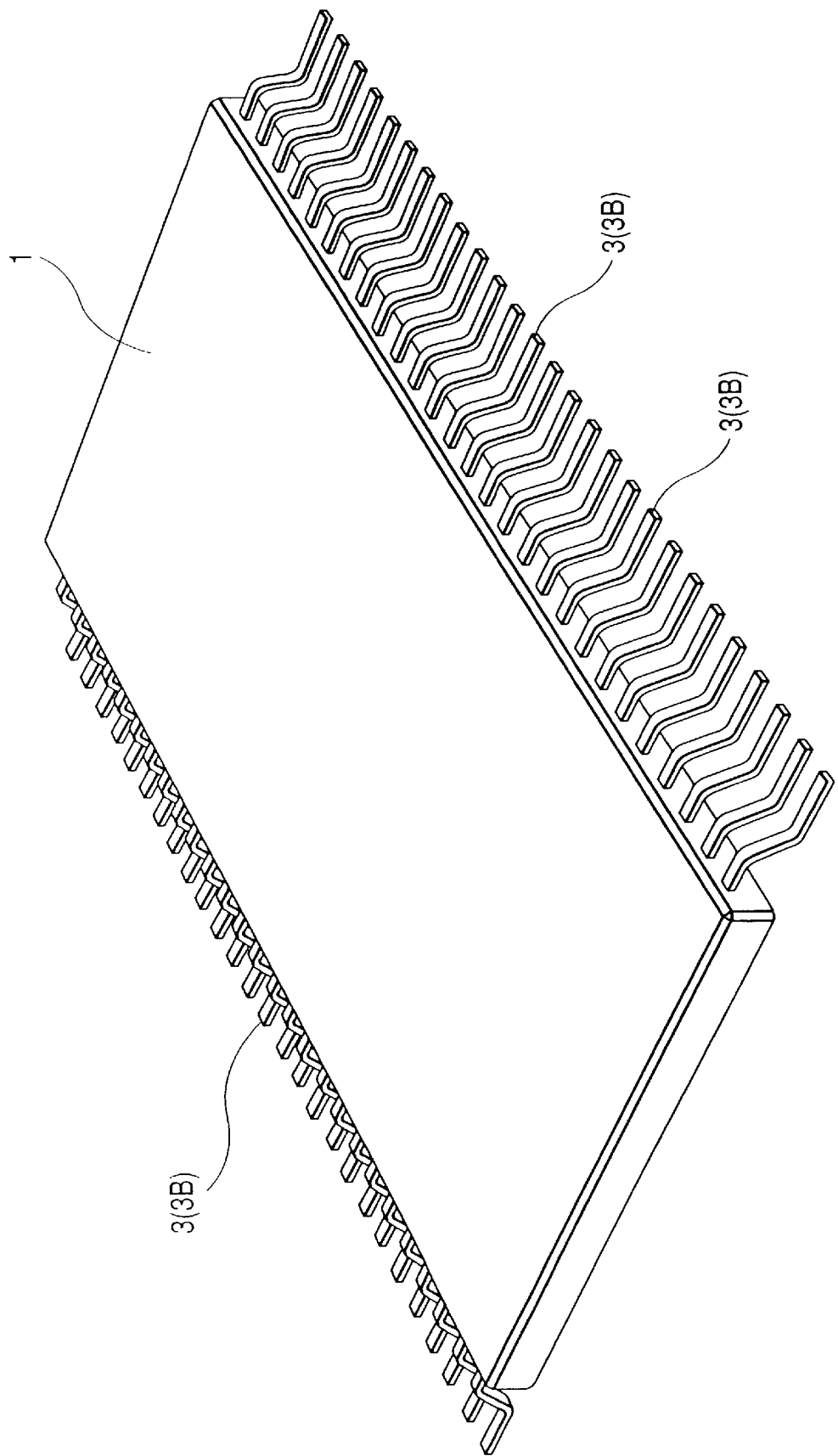
FIG. 1 is a perspective view of a semiconductor device in a first embodiment according to the present invention.

Preferred embodiments of the present invention will be described hereinafter with reference to the accompanying drawings, in which like or corresponding parts are designated by the same reference characters and the repetitive description thereof will be omitted to avoid duplication.

First Embodiment

Figure 2:
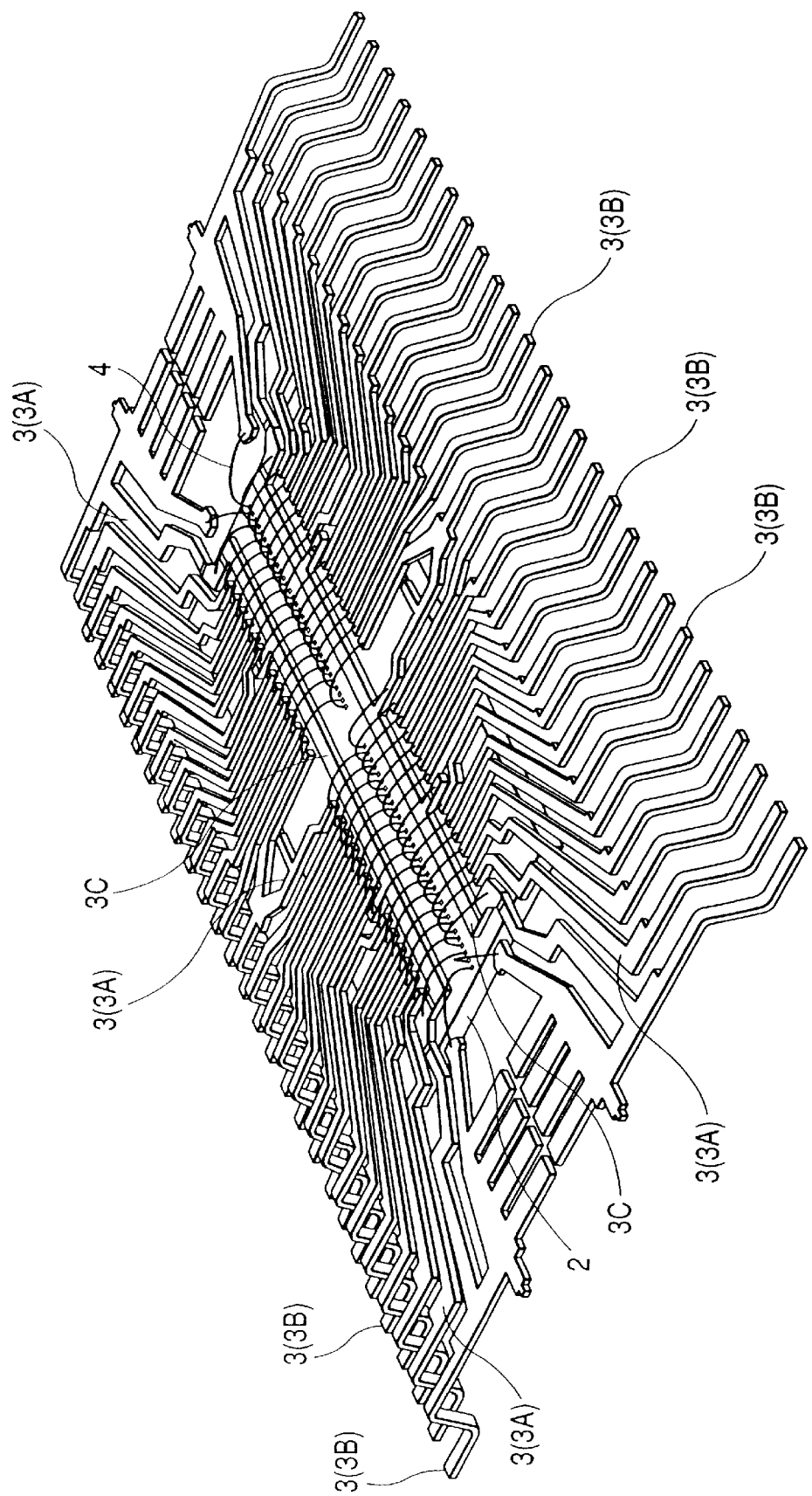
FIG. 2 is a perspective view of the internal structure of the semiconductor device shown in FIG. 1.
Figure 3:
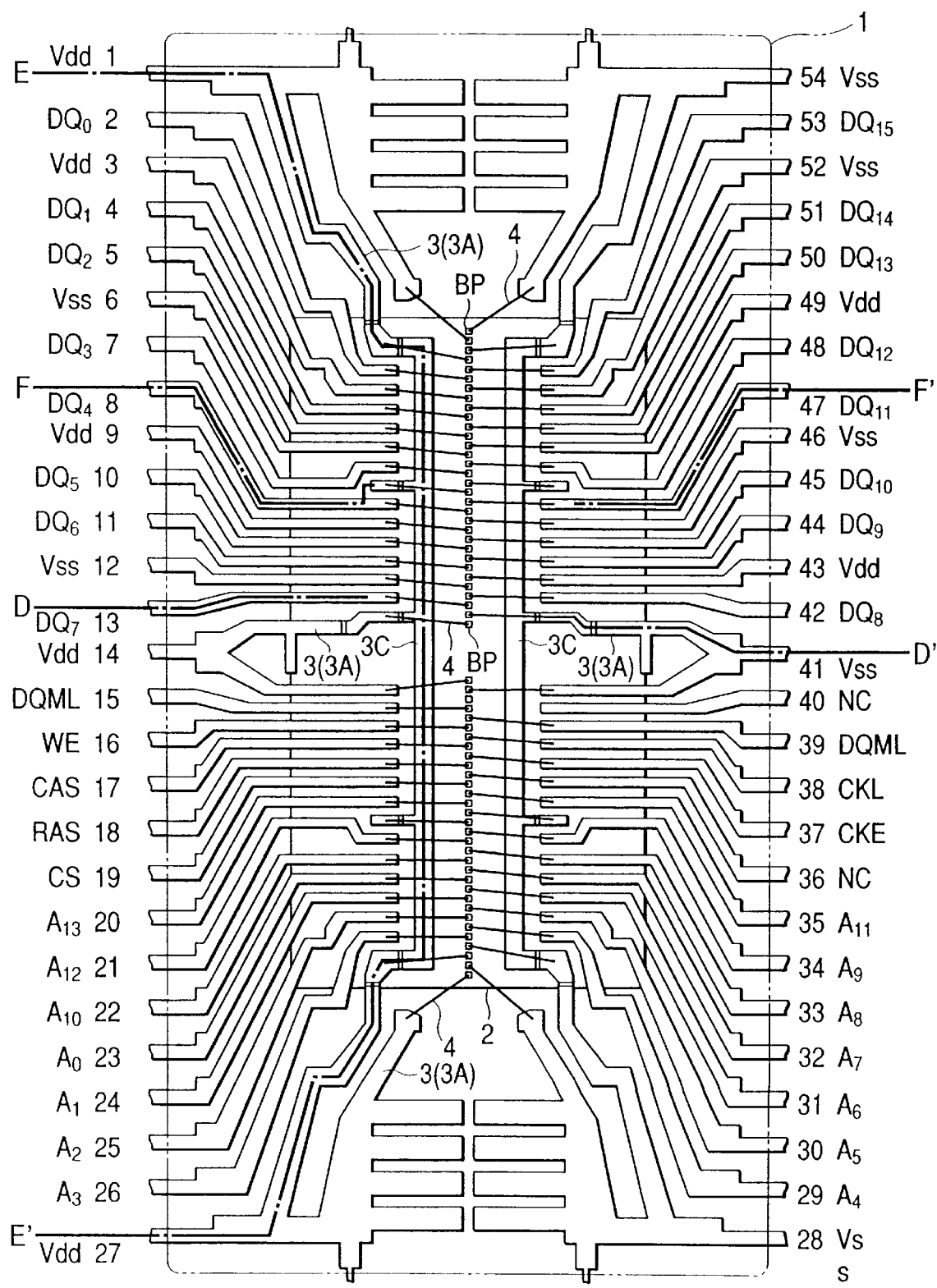
FIG. 3 is a plan view of the internal structure of the semiconductor device shown in FIG. 1.

A semiconductor device in a first embodiment according to the present invention is one of thin, small outline packages (TSOPs), i.e., surface-mount LSI packages. FIG. 1 is a perspective view of the TSOP, i.e., a semiconductor device, FIG. 2 is a schematic perspective view of the internal structure of the TSOP shown in FIG. 1, and FIG. 3 is a plan view of the internal structure of the TSOP.

A package body 1 included in the TSOP is formed by molding an epoxy resin by a transfer molding process and is 400 mil in width and 1 mm in thickness. A rectangular semiconductor chip 2, i.e., a single-crystal Si chip, carrying a dynamic random-access memory (DRAM) of 64 Mbit fabricated thereon is sealed in the package body 1.

Figure 4:
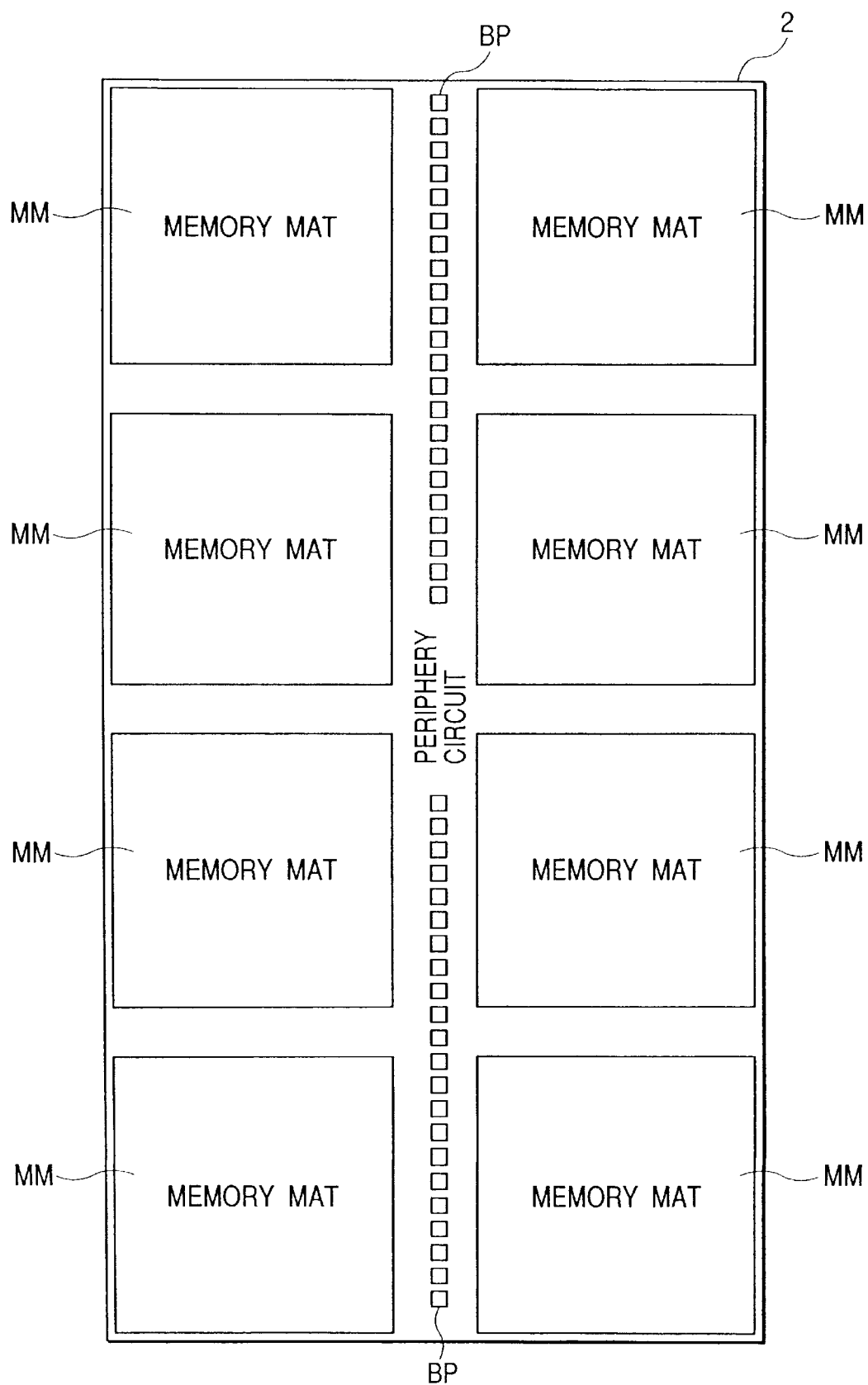
FIG. 4 is an enlarged plan view of a semiconductor IC chip included in the semiconductor device shown in FIG. 1.

As shown in an enlarge view in FIG. 4, the DRAM comprises eight memory mats MM formed on a major surface of the semiconductor chip 2, and peripheral circuits. A plurality of bonding pads BP are arranged in a row parallel to the long sides of the semiconductor chip 2 in a middle region of the major surface of the semiconductor chip 2. Although not shown in FIG. 4, each of the memory mats MM is divided into a plurality of memory arrays each comprising a plurality of memory cells arranged in rows and columns.

The TSOP is of a LOC construction provided with a plurality of leads 3 serving as external terminals and having inner lead parts 3A disposed on the major surface of the semiconductor chip 2. The leads 3 are formed of an Fe—Ni alloy, such as 42-alloy. The inner lead parts 3A of the leads 3 are connected electrically to the bonding pads BP of the semiconductor chip 2 with Au wires 4. The outer lead parts 3B of the leads 3 project outside from the long side surfaces of the package body 1 to form a gull-wing leaded package.

The outer lead parts 3B, i.e., pins, of the leads 3 are numbered sequentially by serial numbers from No. 1 to No. 54 from the outer lead part 3B at the left top position on the package body 1 through the outer lead parts 3B at the right top position on the package body 1 according to standards. A predetermined supply voltage, a reference voltage and signals are applied to the outer lead parts 3B of the leads 3, respectively. For example, a supply voltage $V_{dd}$ of 5 V is applied to the pins Nos. 1, 9, 14, 27, 43 and 49, i.e., power pins or $V_{dd}$ pins, and a fixed reference voltage ($V_{ss}$) of 0 V is applied to the pins Nos. 6, 12, 28, 41, 46 and 49, i.e., reference pins or $V_{ss}$ pins. The rest are signal pins including data I/O pins DQ, address pins A, a write enable pin WE, a column address strobe pin CAS, a row address strobe pin RAS, clock pins CLK and such.

The inner lead parts 3A of the pins Nos. 1, 14 and 27, which constitute parts of the power pins ($V_{dd}$) are formed integrally with a busbar lead 3C longitudinally extended in parallel to the long sides on the major surface of the semiconductor chip 2. Similarly, the inner lead parts 3A of the pins Nos. 28, 41 and 54 which constitute parts of the reference pins are formed integrally with another busbar lead 3C disposed opposite to the former busbar lead 3C with respect to the row of the bonding pads BP.

The inner lead parts 3A serving as the power pins, and the inner lead parts 3A serving as the reference pins are connected to the two elongate busbar leads 3C. Therefore, the supply voltage $V_{dd}$ and the reference voltage $V_{ss}$ can be applied from a desired position on the major surface of the semiconductor chip 2 to the DRAM and hence the fluctuation of the supply voltage due to switching noise can be suppressed and the operating speed of the DRAM can be enhanced.

The inner lead parts 3A serving as the power pins and the reference pins not connected to the busbar leads 3C, i.e., the pins Nos. 6, 9, 12, 43, 46 and 49, and all the inner lead parts 3A of the leads 3 serving as the signal pins are extended in parallel to each other on the major surface of the semiconductor chip 2, and the inner ends of the inner lead parts 3A are arranged in two rows on the opposite sides of the row of the bonding pads BP.

A part of each of the inner lead parts 3A of the leads 3 serving as the pins Nos. 1 and 27, i.e., power pins, is branched in a comblike pattern so as to extend in a corner region in the package body 1 surrounding the semiconductor chip 2. Similarly, a part of each of the inner lead parts 3A serving as the pins Nos. 28 and 54, i.e., reference pins, is branched in a comblike pattern so as to extend in a corner region in the package body 1 surrounding the semiconductor chip 2.

When forming the package body 1 by molding a resin by a molding process, the resin can be distributed evenly to a space on the side of the front surface of the semiconductor chip 2 placed in the cavity of a mold and a space on the side of the back surface of the same because the parts of the inner leads 3A formed in the comblike patterns are arranged in the longitudinal end regions of the package body 1. Consequently, voids attributable to the irregular flow of the resin in the cavity will not be formed in the package body 1 and hence the yield of the molding process can be improved. When part of the comblike pattern is extended to a region near the semiconductor chip 2 and one end of a Au wire 4 is bonded to the extended part, the power pins, i.e., a plurality of Au wires 4 can be bonded to the pins Nos. 1 and 27, and the reference pins, i.e., the pins Nos. 28 and 54, which further suppresses the fluctuation of the supply voltage.

Figure 5A:
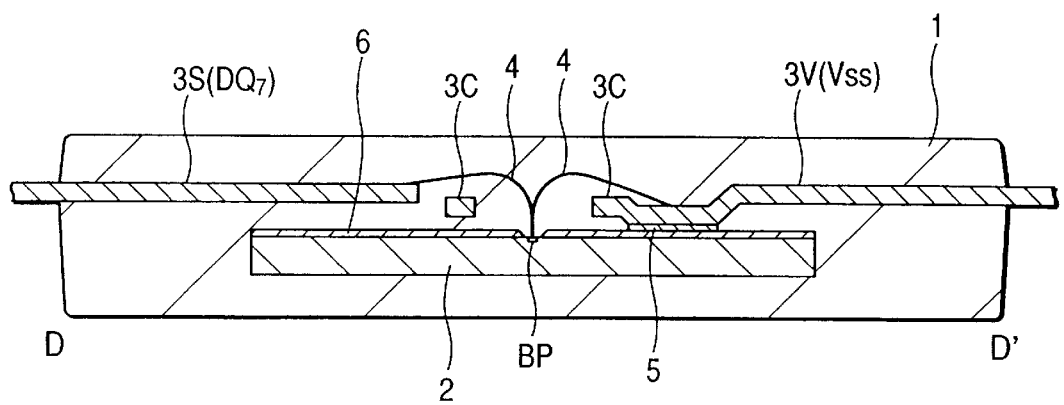
FIGS. 5(a) and 5(b) are typical sectional views taken on line D–D' in FIG. 3.
Figure 6:
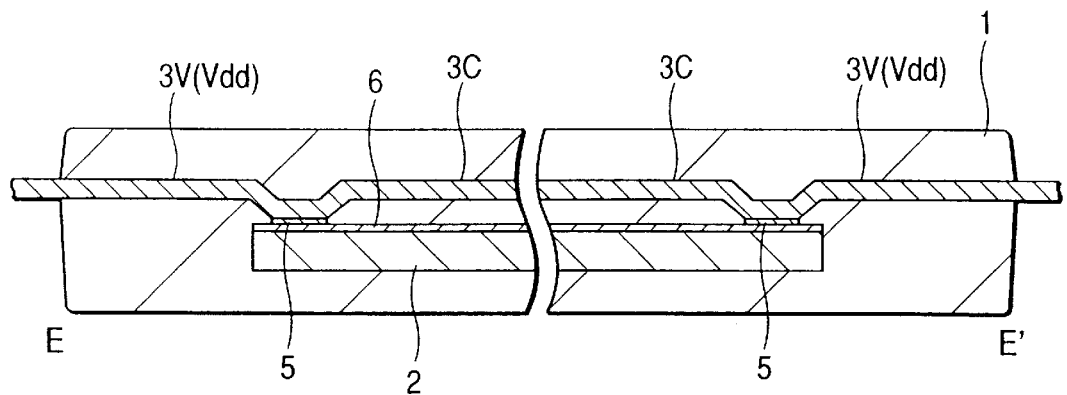
FIG. 6 is a typical sectional view taken on line E–E' in FIG. 3.
Figure 7:
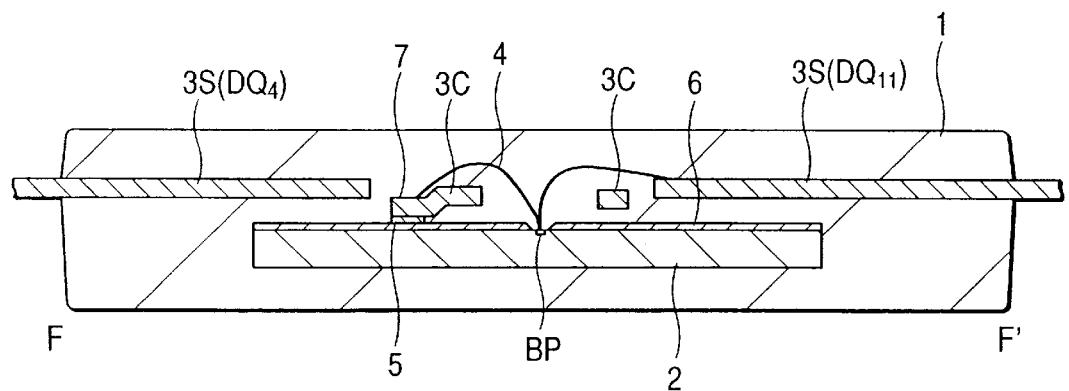
FIG. 7 is a typical sectional view taken on line F—F in FIG. 3.

FIG. 5(a) is a typical sectional view of the package body 1 taken on line D–D' in FIG. 3 (line through the pin No. 13 (DQ7) and the pin No. 41 ($V_{ss}$)), FIG. 6 is a typical sectional view of the package body 1 taken on line E—E in FIG. 3 (line through the pin No. 1 ($V_{dd}$), the busbar lead 3C and the pin No. 27 ($V_{dd}$)), and FIG. 7 is a typical sectional view of the package body 1 taken on line F–F' in FIG. 3 (line through the pin No. 8 (D!4) and the pin No. 47 (DQ11)). In the following description, the leads 3 having the outer lead parts 3B serving as the power pins ($V_{dd}$ pins) and the leads 3 having the outer lead parts 3B serving as the reference pins ($V_{ss}$ pins) will inclusively be called power supply leads 3V, and the leads 3 having the outer lead parts 3B serving as the signal pins will be called signal leads 3S.

Referring to FIGS. 5(a) and 6, the inner lead part 3A of the power supply lead 3V formed integrally with the busbar lead 3C has a depressed portion depressed toward the semiconductor chip 2 and fixed adhesively to the major surface of the semiconductor chip 2 by an adhesive layer 5. The lower surface of the busbar lead 3C is not bonded to and is space from the semiconductor chip 2. The adhesive layer 5 interposed between the lower surface of the power supply lead 3V and the major surface of the semiconductor chip 2 is a heat-resistant thermoplastic adhesive easy to handle and capable of bonding the power supply lead 3V to the semiconductor chip 2 at a high yield, such as a thermoplastic polyimide adhesive, a thermoplastic poly(ether imide) adhesive or the like.

The power supply leads 3V and all the signal leads 3S not connected to the busbar leads 3C, similarly to the busbar leads 3C, are not bonded to and are spaced apart from the semiconductor chip 2. Spaces between the respective lower surfaces of the inner lead parts 3A of the leads 3 and the busbar leads 3C spaced apart from the major surface of the semiconductor chip 2, and the major surface of the semiconductor chip 2 are filled up with the resin forming the package body 1. Regions in the major surface of the semiconductor chip 2 other than a middle region in which the bonding pads BP are formed are coated with an insulating layer 6 of a polyimide resin or the like to absorb shocks that may be exerted on the semiconductor chip 2 by the inner lead parts 3A of the leads 3 in a wire bonding process.

Figure 8:
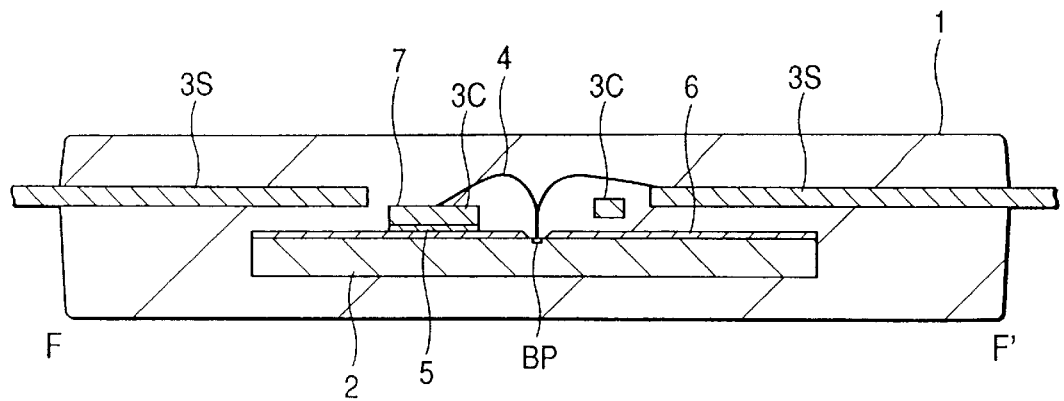
FIG. 8 is a typical sectional view taken on line F—F in FIG. 3.

As shown in FIG. 7, the busbar leads 3C are provided with short projections 7 projecting toward the sides of the semiconductor chip 2. The projections 7 of the busbar leads 3C are connected to Au wires. Although these projections 7 are not necessarily essential, the projections 7 facilitates bonding Au wires to the busbar leads 3C when the semiconductor chip 2 is small, the busbar leads 3C are very close to the bonding pads BP and it is difficult to bond Au wires to the busbar leads 3C. Respective end parts of the projections 7 are depressed toward the semiconductor chip 2 and are bonded to the major surface of the semiconductor chip 2 by the adhesive layer 5. Both the busbar leads 3C and the projections 7 may be bonded adhesively to the major surface of the semiconductor chip 2 as shown in FIG. 8.

In the TSOP in the first embodiment, parts of the power supply leads 3V connected to the busbar leads 3C are depressed (offset) to the chip dorection and are bonded to the major surface of the semiconductor chip 2 by the adhesive layer 5, and the busbar leads 3C and the signal leads 3S are spaced apart from the major surface of the semiconductor chip 2.

Figure 9:
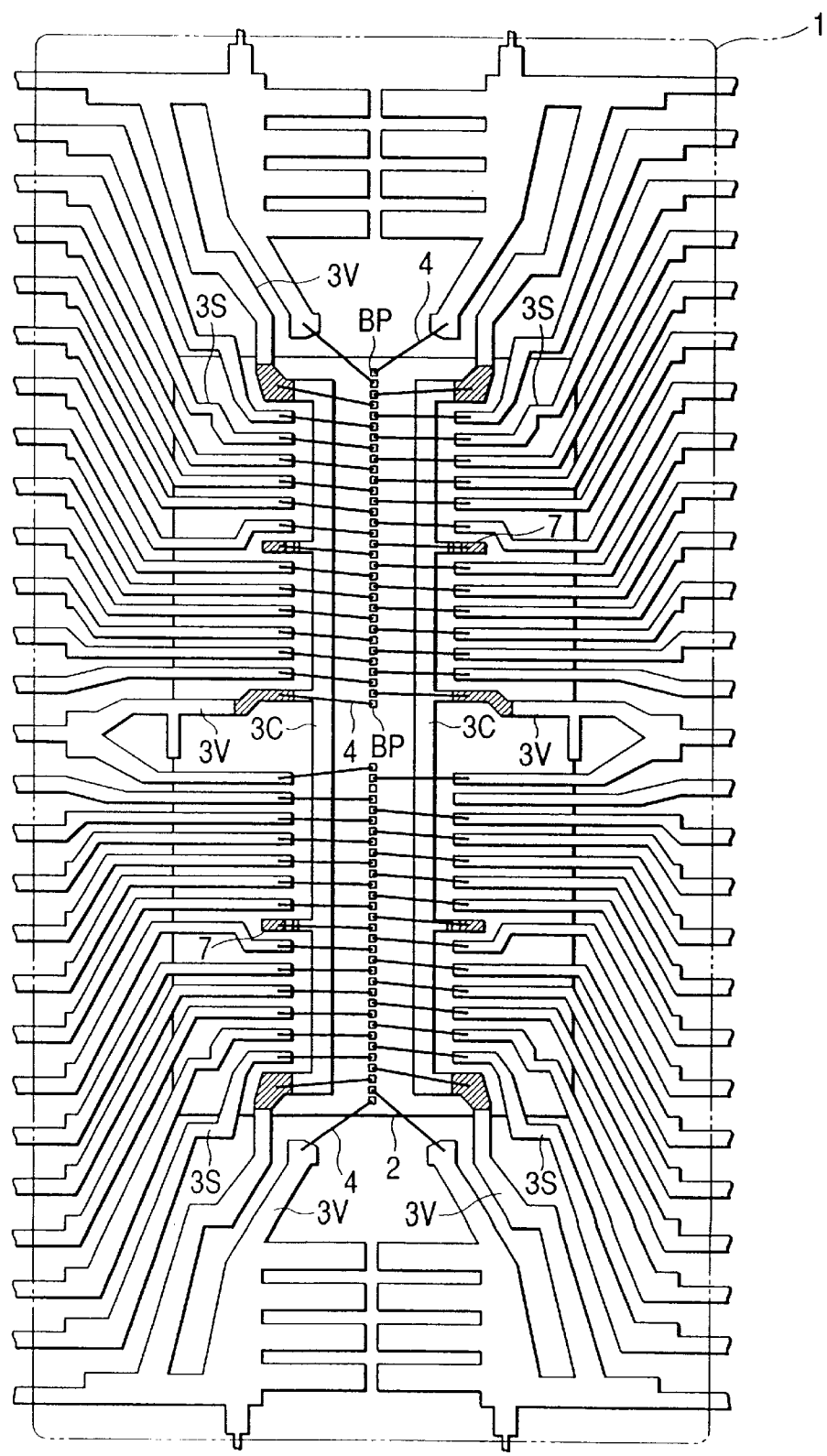
FIG. 9 is a schematic plan view showing a portion of a power lead bonded to a semiconductor chip.

In FIG. 9, ten shaded regions represent bonding regions where the parts of the power supply leads 3V are bonded to the semiconductor chip 2. The bonding regions are in end regions near the opposite longitudinal ends of the semiconductor chip 2, a middle region and regions corresponding to the projections 7, and the five bonding regions among those ten bonding regions are arranged on the right-hand side of the row of the bonding pads BP and the rest are arranged on the left-hand side of the row of the bonding pads BP.

Figure 5B:
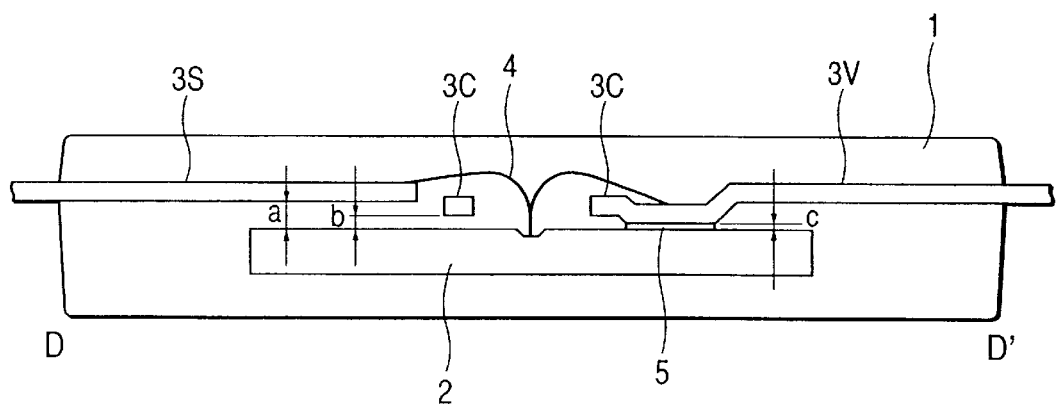

FIG. 5(b) shows an example of the disposition of the leads 3 relative to the major surface of the semiconductor chip 2. As shown in FIG. 5(b), the distance a between the lower surface of the signal lead 3S (the power supply lead 3V not connected to the busbar lead 3C) and the major surface of the semiconductor chip 2 is greater than the distance b between the lower surface of the busbar lead 3C and the major surface of the semiconductor chip 2; that is, the inner lead parts 3A of the signal leads 3S are spaced apart from the major surface of the semiconductor chip 2 more greatly than the busbar leads 3C formed integrally with the power supply leads 3V (a>b). For example, the distance a is about 100 μm and the distance b is in the range of 40 to 50 μm. The thickness c of the adhesive layer 5 is about 10 μM. The thickness of the leads 3 (the power supply leads 3V, the signal leads 3S and the busbar leads 3C) is about 125 μm, and the thickness of the semiconductor chip 2 is about 280 μm. As mentioned above, the thickness of the TSOP is about 1 mm.

It is desirable that bends formed in the power supply leads 3V formed when offsetting portions of the power supply leads 3V toward the semiconductor chip 2 to form the depressed portions lie inside the edges of the semiconductor chip 2. If the bends in the power supply leads 3V are in contact with the major surface of the semiconductor chip 2 at the edges of the semiconductor chip 2, it is possible that fragments of conductive lines formed in a pattern (TEG pattern) and exposed in dicing regions (scribe lines) exposed on the edges of the semiconductor chip 2 when a semiconductor wafer is diced after the completion of DRAM fabricating processes come into contact with the power supply leads 3V to cause shot circuit. For the same reason, it is desirable to space the signal leads 3S apart from the major surface of the semiconductor chip 2 at least 10 μm in view of preventing short circuit. When offsetting the parts of the power supply leads 3V to form the depressed portions, it is desirable that the depressed portions are offset perpendicularly to the surface of the power supply leads 3V because the fine, easily distortable leads 3 can be bent in a high dimensional accuracy when the parts of the leads 3 are offset perpendicularly to the surface of the leads 3.

The DRAM, not shown, built on the major surface of the semiconductor chip 2 comprises transistors forming memory cells and peripheral circuits, and a plurality of wiring layers formed over the transistors and having signal lines connected to the transistors and power lines for applying the supply voltage and the reference voltage to the transistors. The signal lines and the power lines are electrically connected to the bonding pads BP connected to wiring lines formed in the top wiring layer.

The busbar leads 3C, the inner end parts 3A of the power supply leads 3V and the signal leads 3S are arranged over the major surface of the semiconductor chip 2, and the same are electrically connected to the corresponding bonding pads BP by the Au wires 4. The power supply leads 3V and the signal leads 3S are arranged over the multiple wiring layers of the semiconductor chip 2 in a protective film (passivation film) covering the top wiring layer of the semiconductor chip 2 or the insulating layer 6 formed on the protective layer. Therefore, the power supply leads 3V and the signal leads 3S give stray capacitances (parasitic capacitance). It is desirable that the stray capacitance given by the power supply leads 3V is large in view of preventing the fluctuation of the supply voltage and that the stray capacitance given by the signal lines 3S is small in view of enhancing signal transmission speed.

In the TSOP in this embodiment, in which the inner lead parts 3A of the signal leads 3S is spaced apart more greatly from the major surface of the semiconductor chip 2 than the busbar leads 3C formed integrally with the power supply leads 3V, the stray capacitance given by the signal leads 3S is small. In the TSOP in this embodiment, in which the busbar leads 3C formed integrally with the power supply leads 3V are arranged closer to the major surface of the semiconductor chip 2 than the signal leads 3S, the stray capacitance given by the power supply leads 3V is large. Thus, the TSOP in this embodiment is capable of reducing the fluctuation of the supply voltage due to switching noise and of transmitting signals at a high signal transmission speed.

Since the inner lead parts 3A of the signal leads 3S are spaced apart more greatly from the major surface of the semiconductor chip 2 than the busbar leads 3C, short circuit due to the undesired contact between the Au wires extended across the busbar leads 3C between the signal leads 3S and the bonding pads BP, and the busbar leads 3C can surely be prevented.

Figure 10:
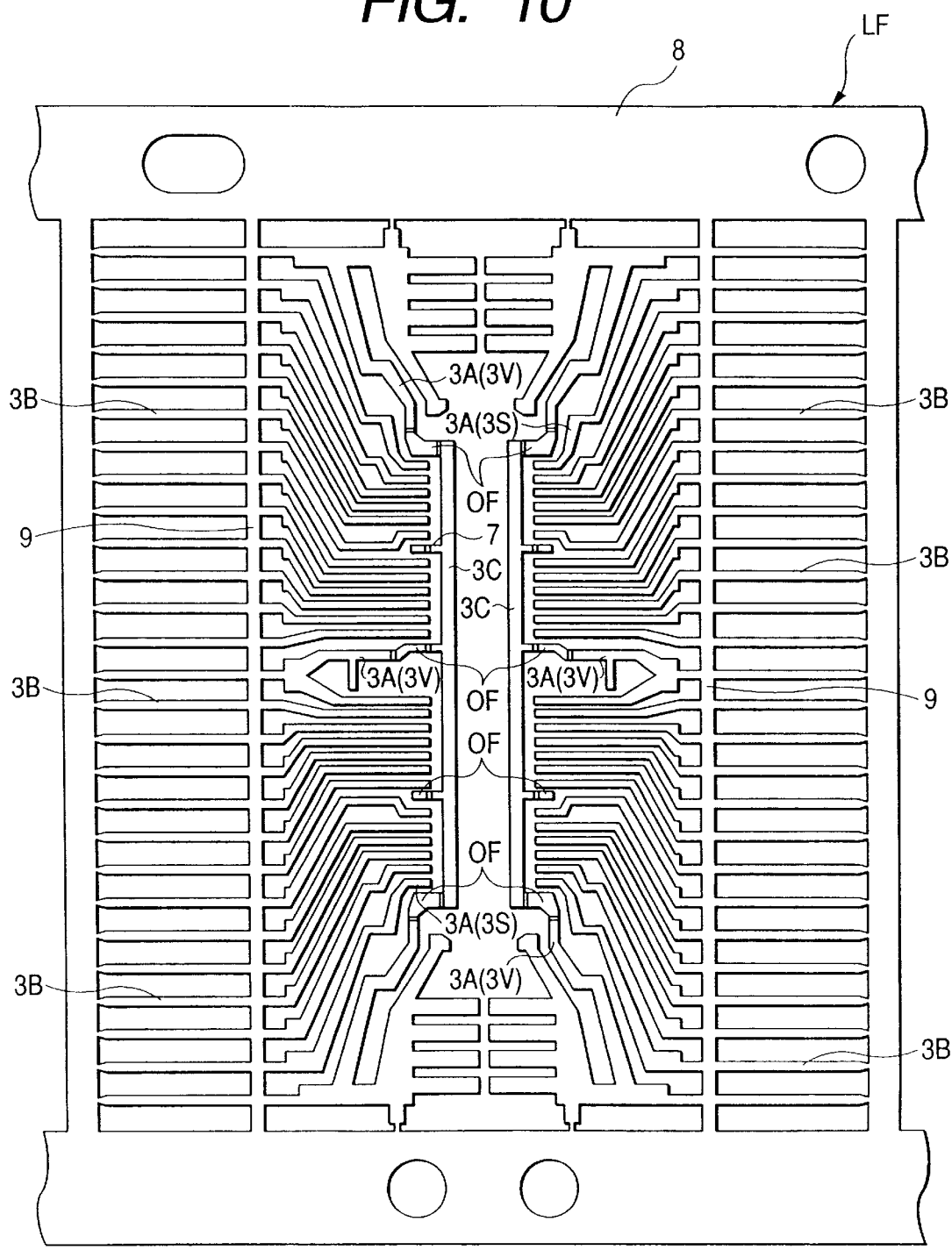
FIG. 10 is a schematic plan view of a lead frame employed in fabricating the semiconductor device in the first embodiment according to the present invention.

FIG. 10 is a schematic plan view of a lead frame LF employed in the TSOP in the first embodiment. Practically, a plurality of lead frames are formed in a ribbon for the simultaneous fabrication of a plurality of TSOPs, for example, six TSOPS. In FIG. 10, only one section, i.e., one lead frame, for one TSOP among a plurality sections of a lead frame ribbon is shown.

The lead frame LF has the power supply leads 3V, the busbar leads 3C and the signal leads 3S formed in a lead pattern in a rectangular region surrounded by a frame 8. The power supply leads 3V and the signal leads 3S have the inner lead parts 3A to be sealed in the package body 1 and the outer lead parts 3B to be projected outside from the package body 1. The power supply leads 3V and the signal leads 3S are connected by tie bars 9.

The lead frame LF is made by forming the lead pattern by subjecting a sheet (hoop) of 42-alloy or a Fe—Ni alloy to a press working or an etching process, forming connecting parts OF to be connected to the semiconductor chip 2 by depressing portions of the power supply leads 3V by press working, and Au-plating portions of the leads 3 to which Au wires are bonded.

Figure 11:
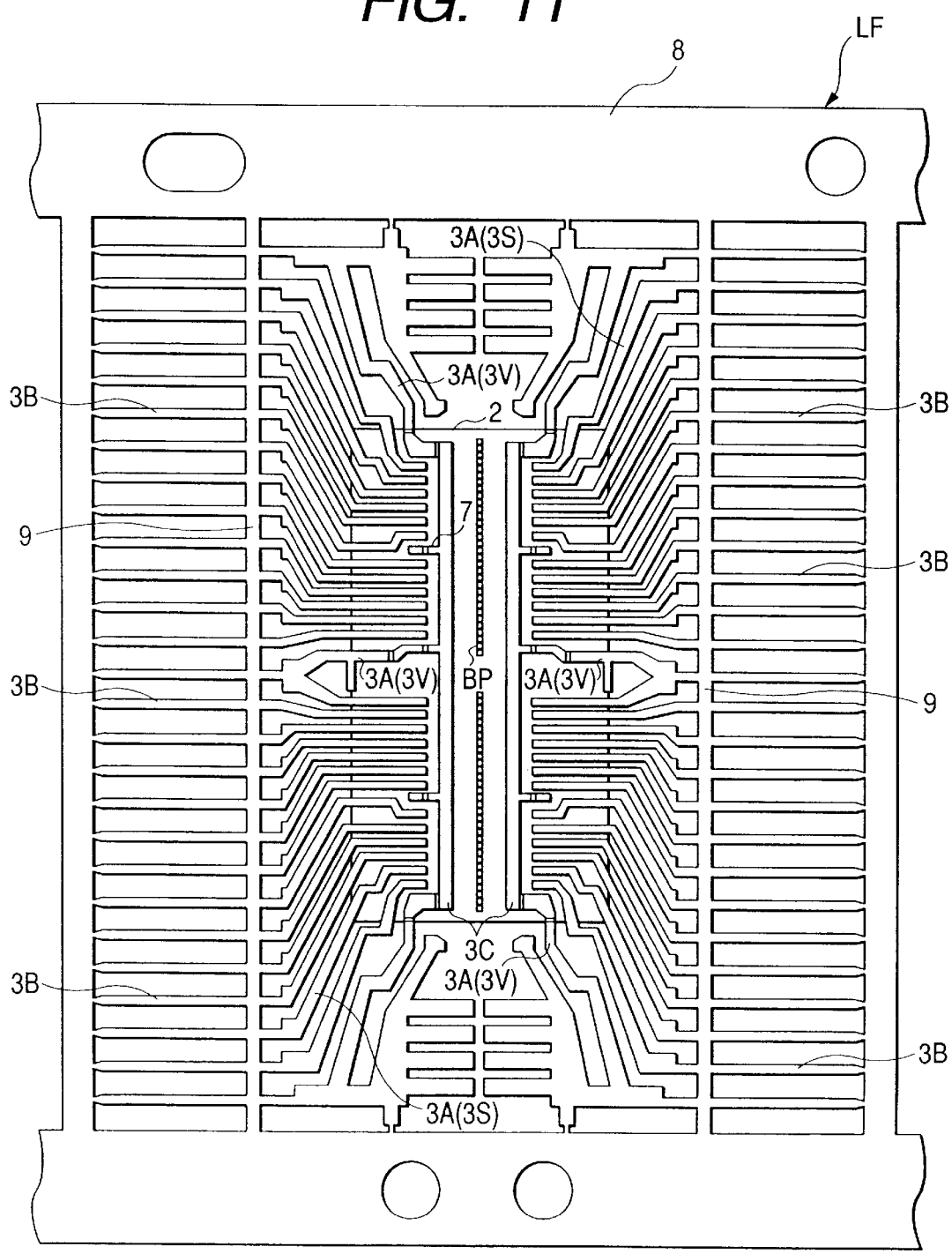
FIG. 11 is a schematic plan view of the lead frame in a process of fabricating the semiconductor device in the first embodiment according to the present invention.

When assembling the TSOP employing this lead frame LF, the semiconductor chip 2 is held fixedly on the lead frame LF as shown in FIG. 11 by applying an adhesive to the lower surfaces of the depressed portions of the power supply leads 3V by a dispenser or the like, and bonding the semiconductor chip 2 to the major surface of the lead frame LF with the inner lead parts 3A of the lead frame LF correctly positioned. The semiconductor chip 2 is positioned on the lead frame LF in a correct positional relation with the inner lead parts 3A by forming positioning patterns 10 in the inner lead parts 3A and placing the semiconductor chip 2 with its edges superposed on the positioning patterns 10. Adhesive sheets of a size substantially equal to that of the depressed portions may be placed under the depressed portions instead of applying an adhesive to the lower surfaces of the depressed portions by the dispenser.

Figure 12:
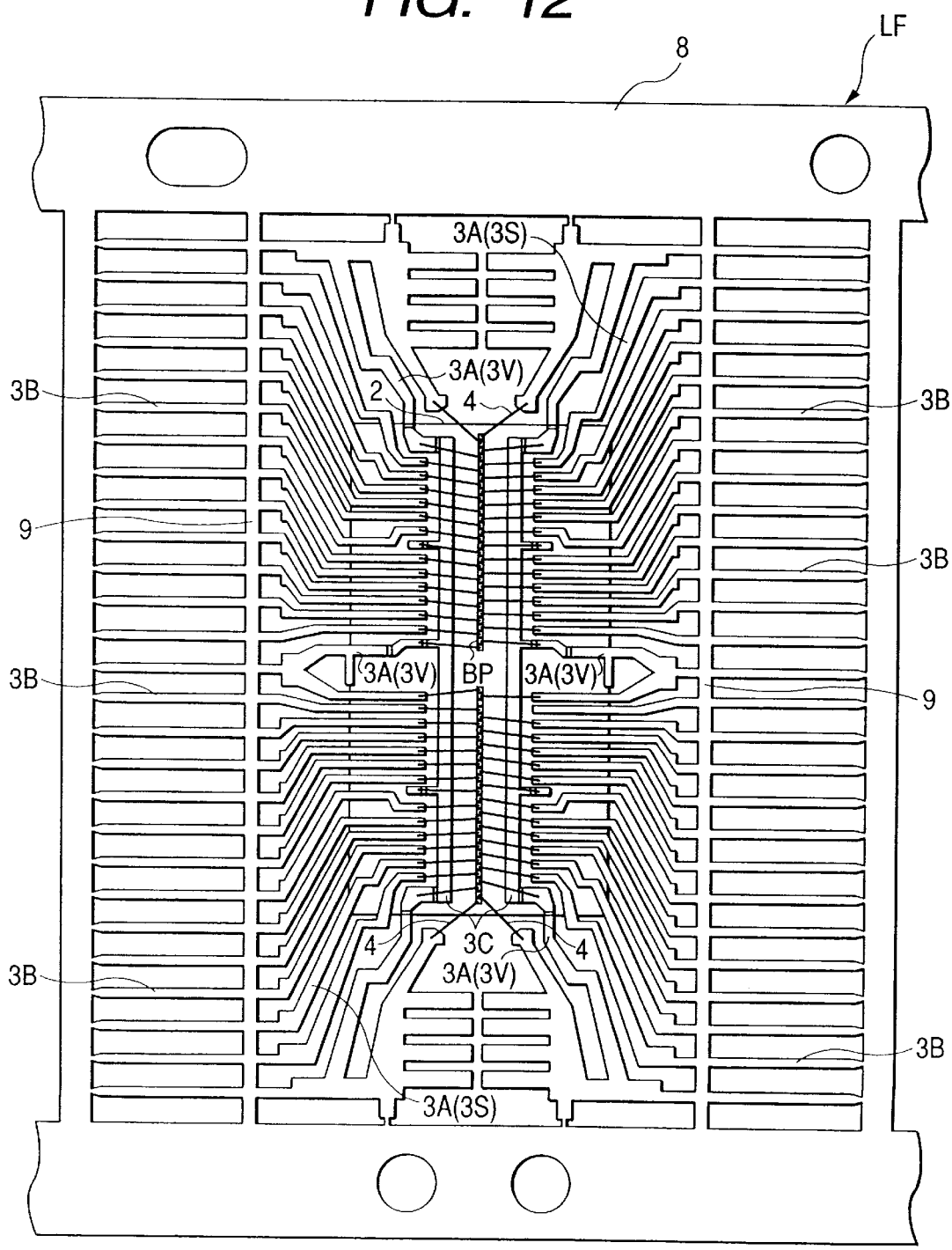
FIG. 12 is a schematic plan view of the lead frame in a process of fabricating the semiconductor device in the first embodiment according to the present invention.
Figure 13A:
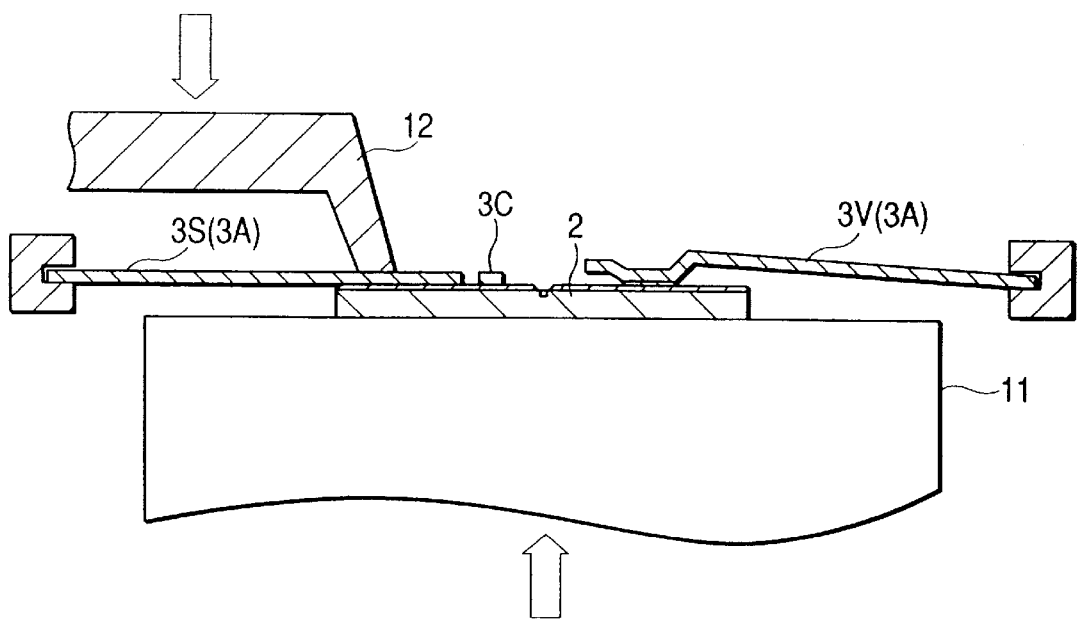
FIGS. 13(a) and 13(b) are typical sectional views of assistance in explaining a wire bonding process for electrically connecting the semiconductor device in the first embodiment according to the present invention to leads.
Figure 13B:
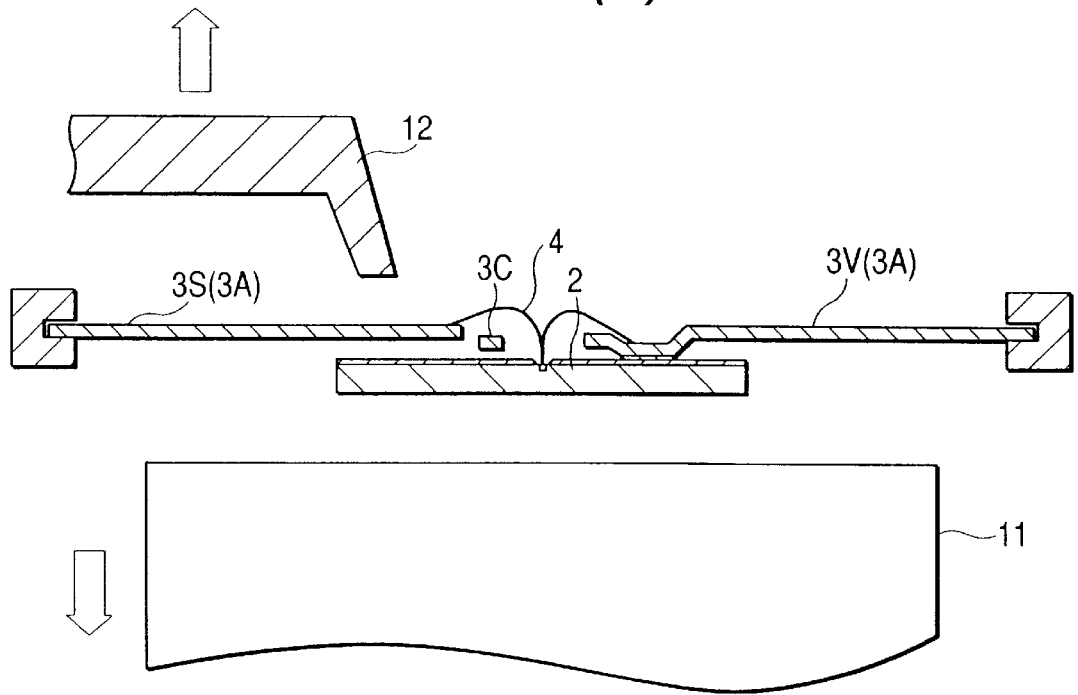

Then, as shown in FIG. 12, the inner lead parts 3A are electrically connected to the bonding pads BP of the semiconductor chip 2 by the Au wires 4. When bonding the Au wires 4 to the signal leads 3S spaced apart from the major surface of the semiconductor chip 2, the inner lead parts 3A of the signal leads 3S are pressed against the major surface of the semiconductor chip 2 with a damper 12 as shown in FIG. 13(a). The inner lead parts 3A return to their original positions by their own resilience when the damper 12 is removed therefrom after bonding as shown in FIG. 13(b).

When the leads of the lead frame LF are formed in a desired lead pattern by press working, fine needlelike burrs extending in a pressing direction are formed on the edges of the surfaces of the inner lead parts 3A. Therefore,it is desirable to combine the lead frame LF and the semiconductor chip 2 so that the burrs extend away from the major surface of the semiconductor chip 2 when the inner lead parts 3A are pressed against the major surface of the semiconductor chip 2 in view of preventing damaging the major surface of the semiconductor chip 2 with the burrs.

Figure 14:
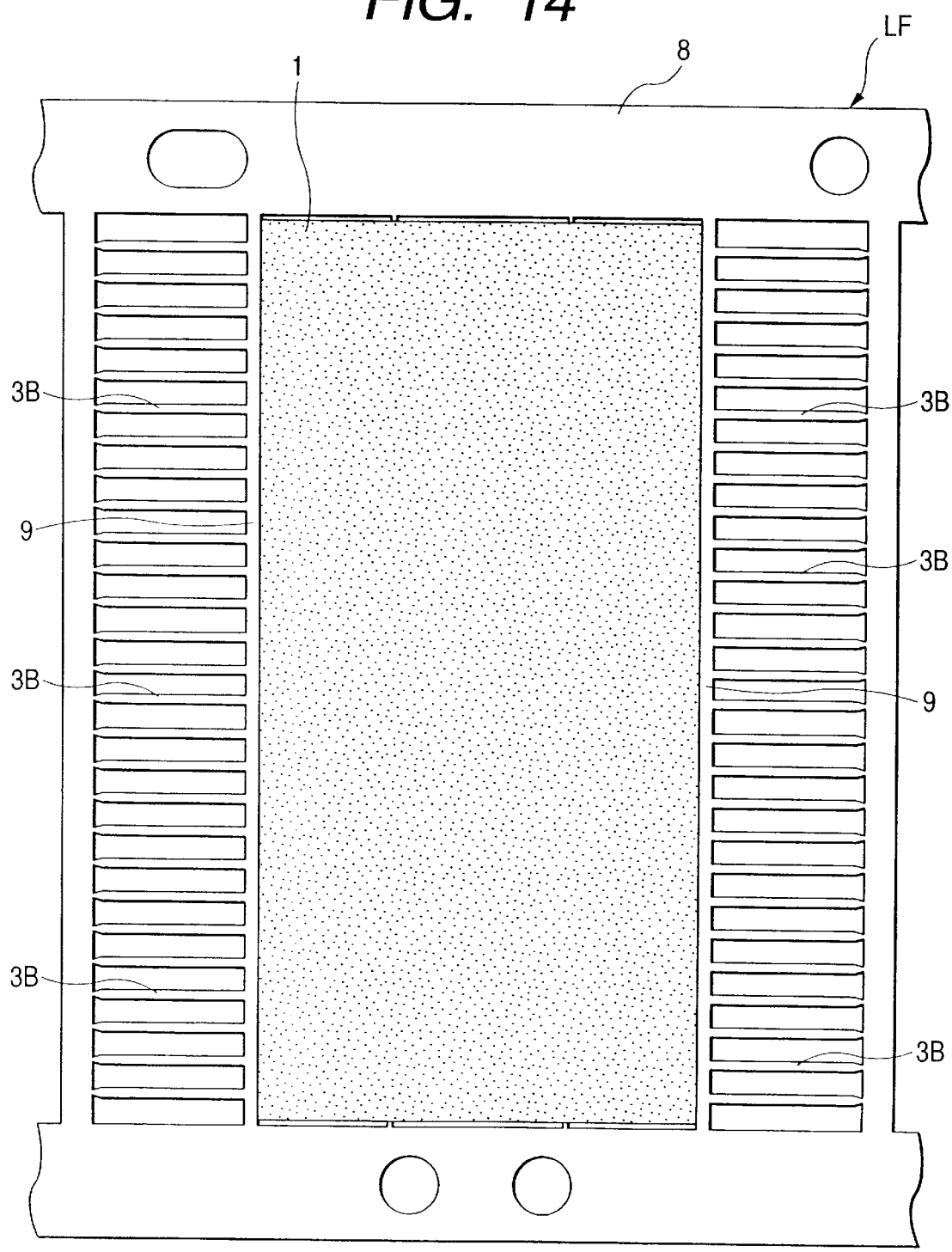
FIG. 14 is a schematic plan view of a lead frame employed in fabricating the semiconductor device in the first embodiment according to the present invention.

Subsequently, as shown in FIG. 14, the package body 1 is formed by molding in a mold. Then, unnecessary parts of the lead frame LF extending outside the package body I are cut and removed, the outer lead parts 3B are bent in the shape of gull wing to complete the TSOP shown in FIGS. 1 and 2.

When mounting the TSOP on a printed wiring board, the TSOP is placed on the printed wiring board with the solder-plated outer lead parts 3B aligned with corresponding electrodes of the printed wiring board. The surfaces of the electrodes are coated with a solder paste by printing. The outer lead parts 3B are held temporarily on the electrodes by the adhesion of the solder paste. The outer lead parts 3B may temporarily be held on the electrodes by partly melting the solder coating the outer lead parts 3B by preheating. Then, the outer lead parts 3B are bonded to the electrodes by reflowing the solder coating the outer lead parts 3B.

Second Embodiment

Figure 15:
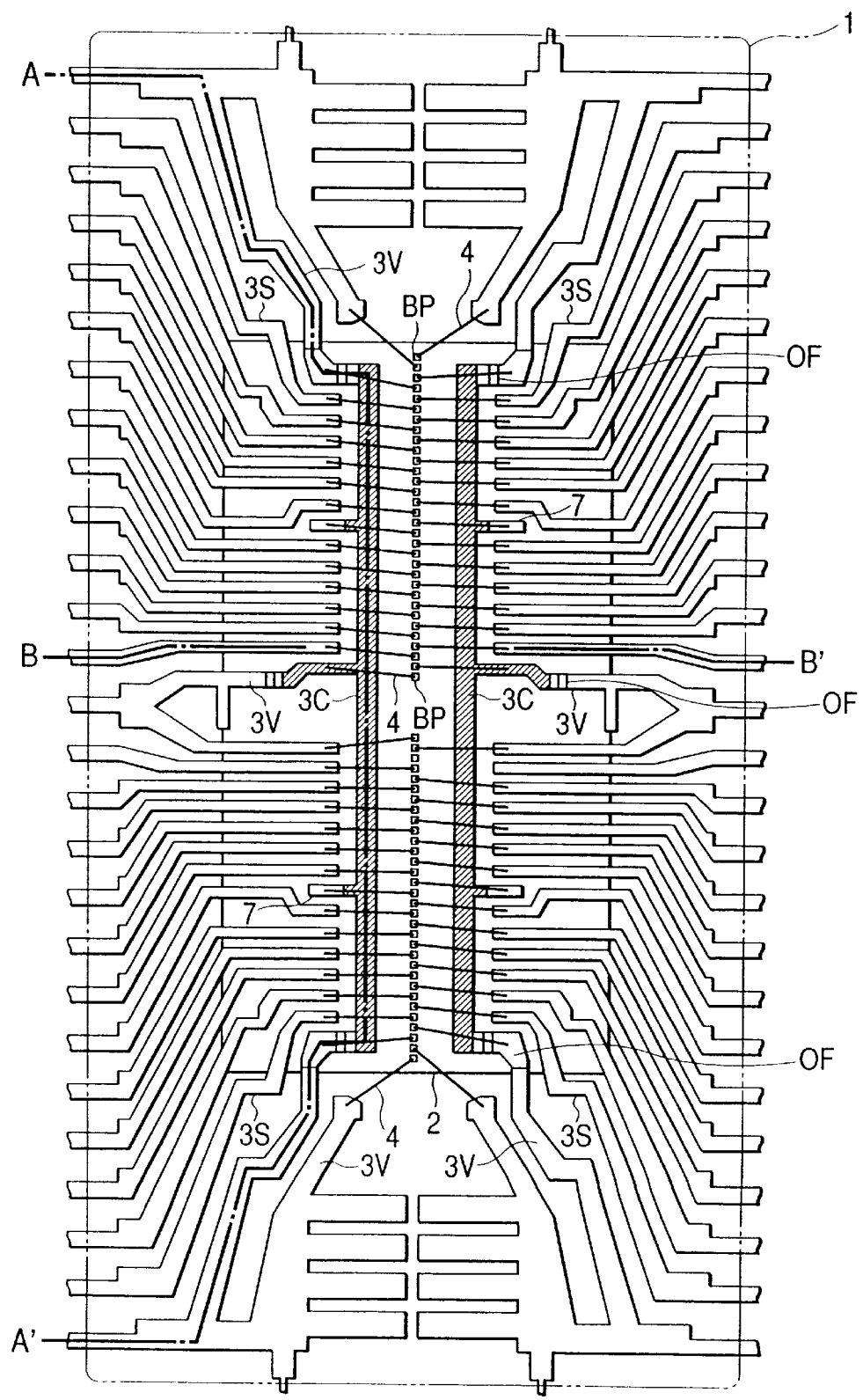
FIG. 15 is a schematic plan view of a semiconductor device in a second embodiment according to the present invention.
Figure 16:
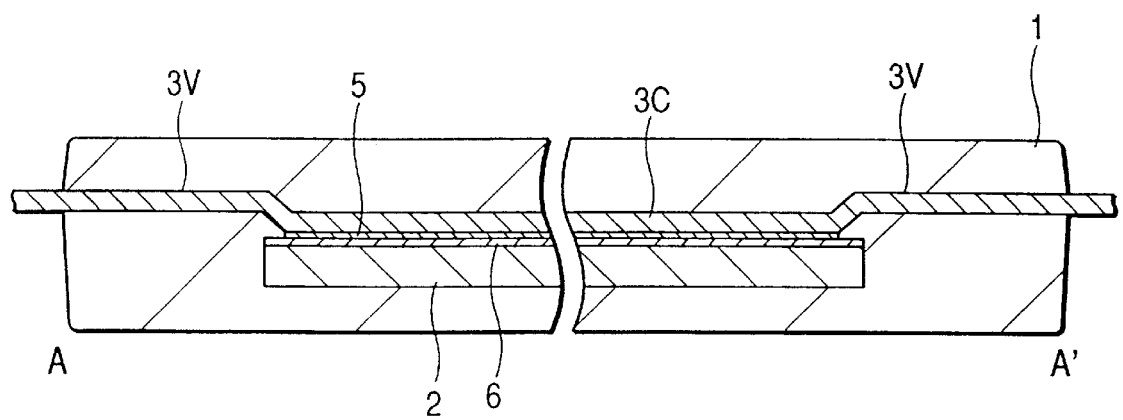
FIG. 16 is a typical sectional view taken on line A—A in FIG. 15.
Figure 17:
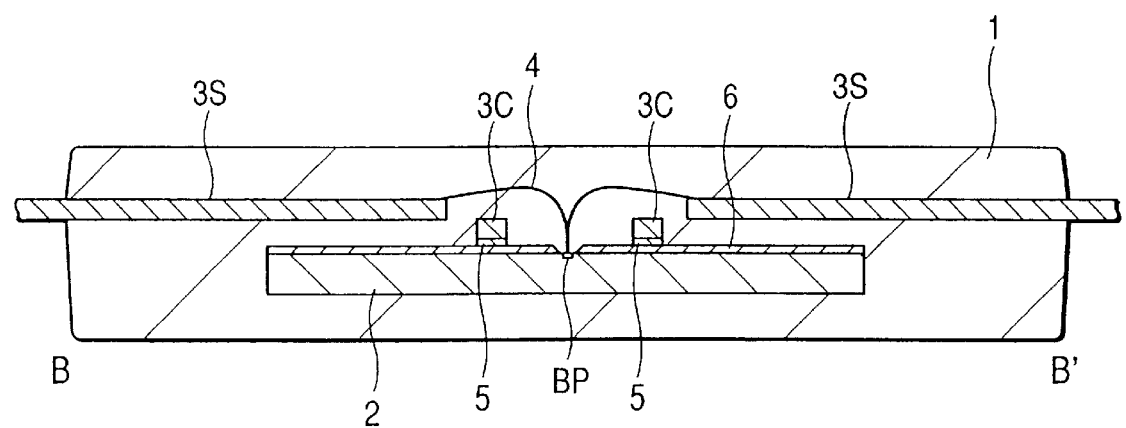
FIG. 17 is a typical sectional view taken on line B—B in FIG. 15.

FIG. 15 is a schematic plan view of a TSOP in a second embodiment according to the present invention, FIG. 16 is a typical sectional view taken on line A—A in FIG. 15, and FIG. 17 is a typical sectional view taken on line B—B in FIG. 15.

The TSOP in the second embodiment has power supply leads 3V formed integrally with busbar leads 3C. Parts OF of the power supply leads 3V formed near the opposite longitudinal ends and the middle part of a semiconductor chip 2 are depressed (offset) toward the semiconductor chip 2, and the busbar leads 3C are bonded to a major surface of the semiconductor, chip 2 by an adhesive layer 5. Signal leads 3S of the TSOP,similarly to those of the TSOP in the first embodiment, are spaced apart from the major surface of the semiconductor chip 2.

The adhesive layer 5 bonding the busbar leads 3C to the semiconductor chip 2 is formed over the entire lower surfaces of the busbar leads 3C as indicated by shaded regions in FIG. 15. The adhesive layer 5 may be formed by applying an adhesive to the entire lower surfaces of the busbar leads 3C by a dispenser or may be formed on the major surface of the semiconductor chip 2 by a screen printing process.

If the lower surfaces of the busbar leads 3C are spaced apart from the major surface of the semiconductor chip 2 and the gaps between the busbar leads 3C and the semiconductor chip 2 are excessively narrow, a resin is unable to flow into the gaps satisfactorily so as to fully fill up the gaps when sealing the semiconductor chip 2 in the resin by molding and, consequently, voids are formed between the busbar leads 3C and the semiconductor chip 2. The adhesive layer 5 underlying the busbar leads 3C surely prevents such faulty molding.

Figure 18:
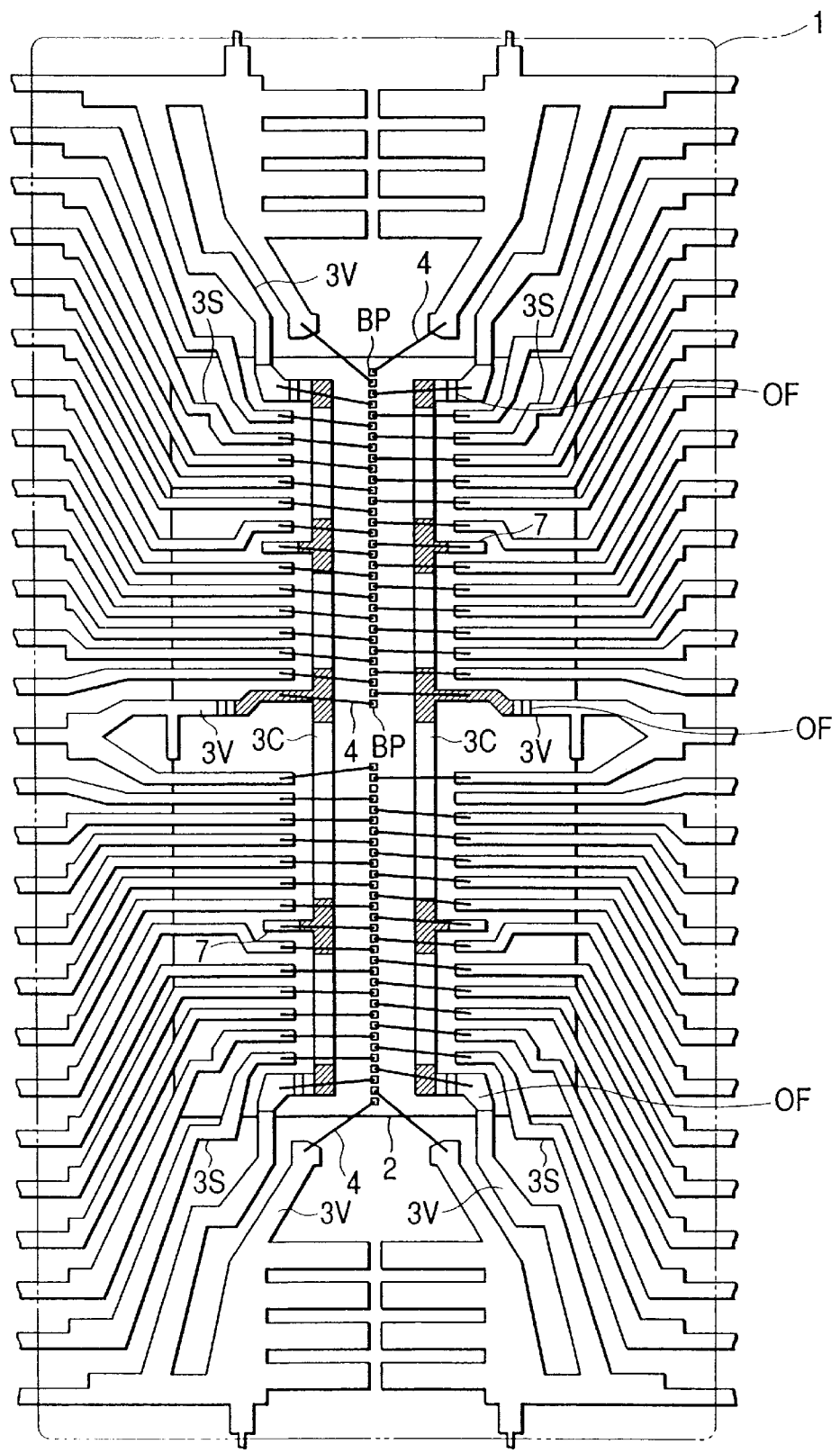
FIG. 18 is a schematic plan view showing regions in which a power lead is attached adhesively to a semiconductor chip.
Figure 19:
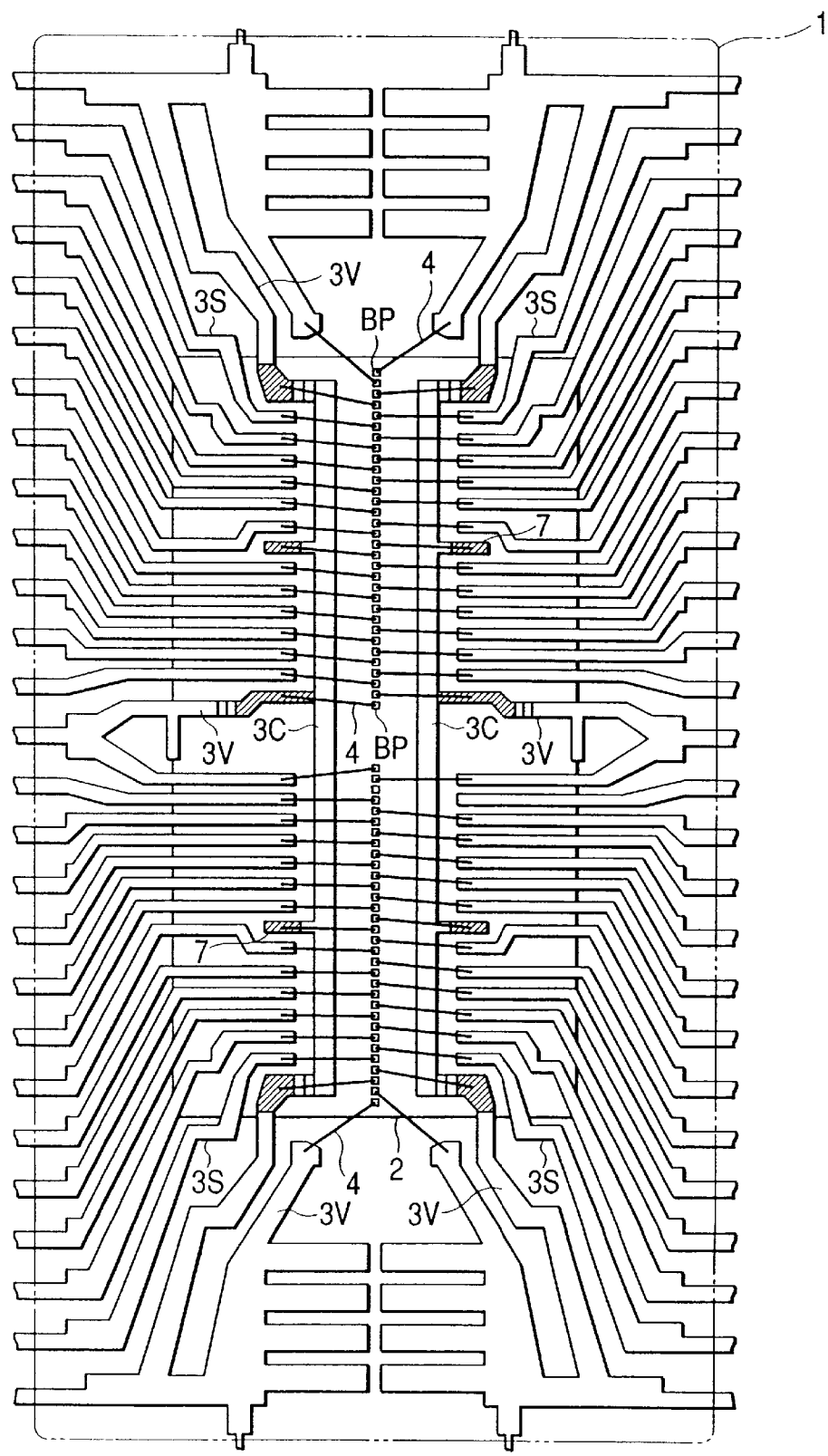
FIG. 19 is a schematic plan view showing regions in which a power lead is attached adhesively to a semiconductor chip.

The adhesive layer 5 bonding the busbar leads 3C to the semiconductor chip 2 may be formed in a pattern of spots arranged at predetermined intervals as indicated by shaded regions in FIG. 18. The spots of the adhesive layer 5 can simultaneously be formed by applying the adhesive to a plurality of regions by a dispenser provided with a plurality of needles. A process for thus forming the adhesive layer 5 in a pattern of spots is simpler than a process for forming over the entire lower surfaces of the busbar leads 3C.

The adhesive layer 5 bonding the busbar leads 3C to the semiconductor chip 2 may be formed only in regions where power supply leads 3V and bonding pads BP are connected by Au wires to absorb shocks that may be exerted on the semiconductor chip 2 during wire bonding by the adhesive layer 5.

Third Embodiment

Figure 20:
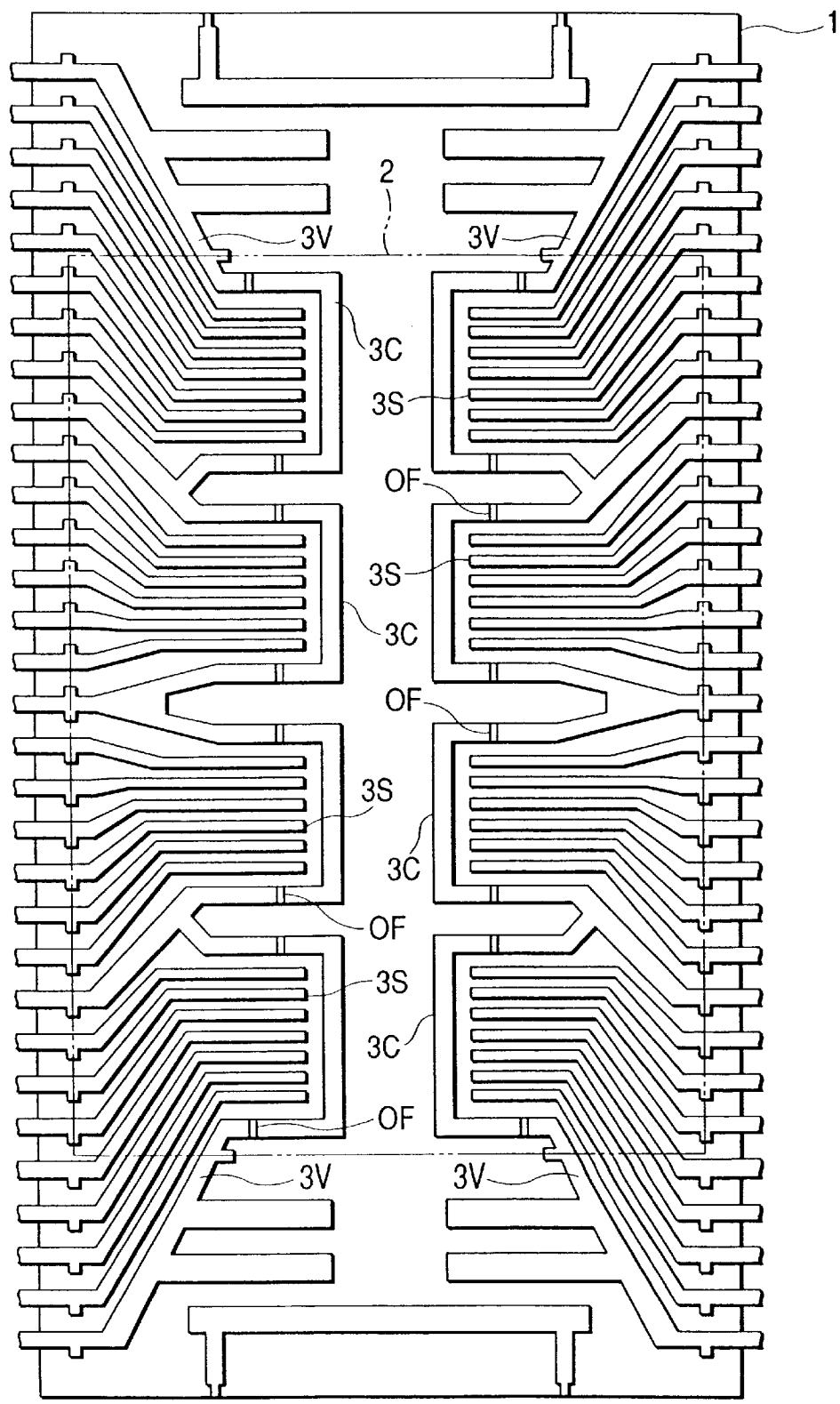
FIG. 20 is a schematic plan view of a semiconductor device in a third embodiment according to the present invention.

FIG. 20 is a schematic plan view of a TSOP in a third embodiment according to the present invention. This TSOP is provided with leads 3 of Cu having a heat conductivity higher than that of a Fe—Ni alloy, such as 42-alloy, to reduce the thermal resistance thereof. For example, a 256 Mbit DRAM is built on a major surface of a semiconductor chip 2 sealed in a package body 1, and the size of the semiconductor chip 2 is somewhat greater than those of the semiconductor chips 2 included in the TSOPs in the first and second embodiment.

Leads 3 may be bonded to the semiconductor chip 2, similarly to those of the first embodiment, by bonding depressed portions formed by depressing parts of power supply leads 3V toward the semiconductor chip 2 to the semiconductor chip 2, busbar leads 3C may entirely be bonded to the main surface of the semiconductor chip 2 similarly to those of the second embodiment, and adhesive layer 5 may be formed only in regions corresponding to parts of the busbar leads 3C to which Au wires are to be bonded. Signal leads 3S are spaced apart from the major surface of the semiconductor chip 2. Although the Cu leads 3 reduces the thermal resistance of the TSOP, increased stress is induced in the adhesive layer 5 when the semiconductor chip 2 sealed in a package body has a large size or consumes much power due to the difference in coefficient of thermal expansion between the semiconductor chip 2 and a package body 1 sealing the semiconductor chip 2 therein because the coefficient of linear expansion of Cu is greater than that of a Fe—Ni alloy, which affects adversely to the reliability of the adhesive layer 5.

To solve such a problem, each of the busbar leads 3C is provided with substantially V-shaped parts formed by bending the busbar leads 3C in a plane parallel to the major surface of the semiconductor chip 2 so that the busbar leads 3C are able to be distorted to absorb stress induced in the adhesive layer 5. Consequently, stress induced in the adhesive layer 5 can be reduced to enhance the reliability of the adhesive layer 5.

Figure 21:
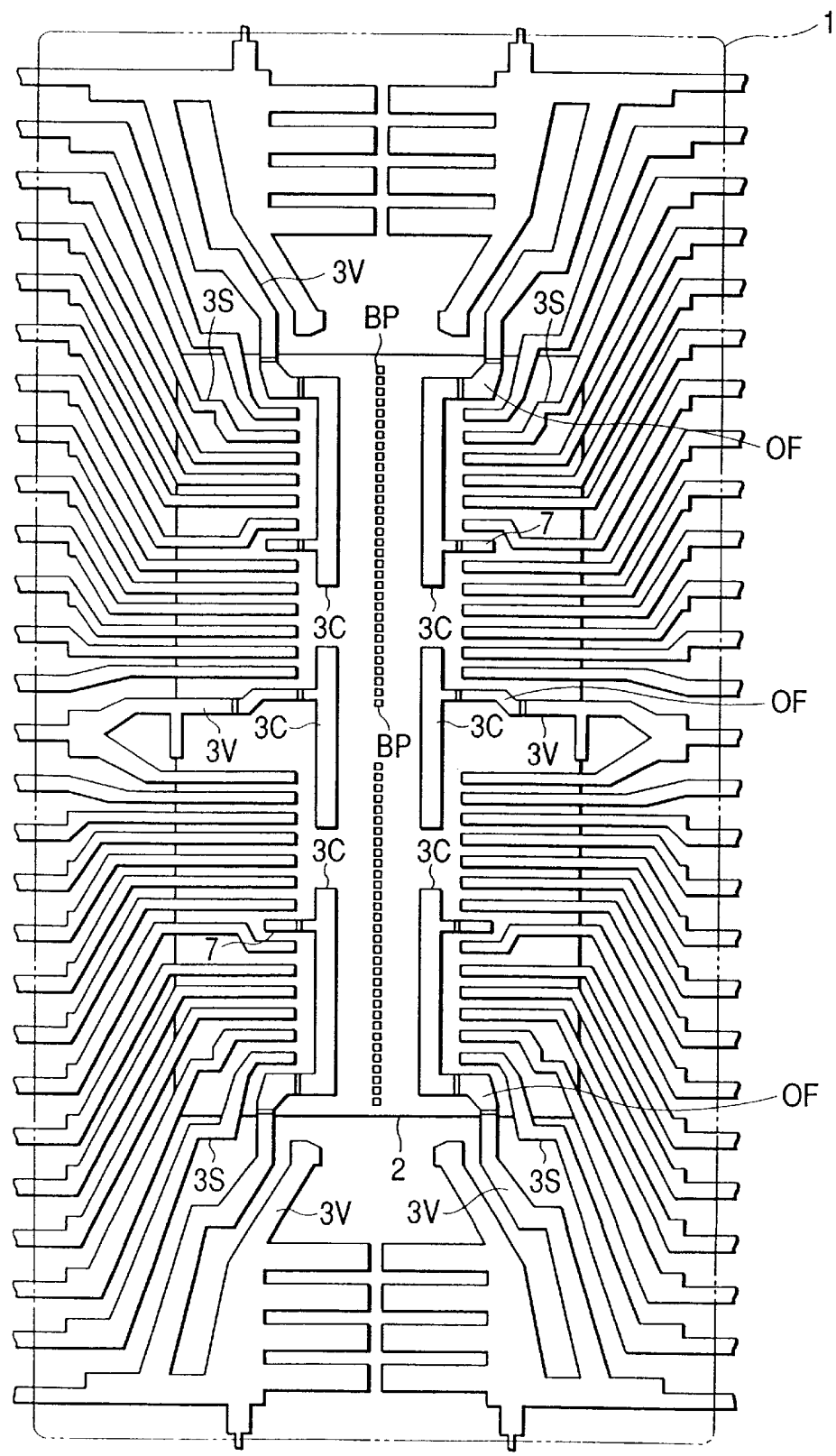
FIG. 21 is a schematic plan view of a pattern of a busbar lead.

The two busbar leads 3C need not necessarily be disposed one on each side of the row of the bonding pads BP. For example, The busbar leads 3C may be connected only to either the leads 3 having the outer end parts 3B serving as the power pins ($V_{dd}$ pins) or those having the outer end parts 3B serving as reference pins ($V_{ss}$ pins). The busbar leads 3C may be formed in a pattern of separate sections as shown in FIG. 21 instead of a pattern of straight lines as those of the first and the second embodiment or a pattern having rectangular bends as those of the third embodiment. All the inner lead parts 3A of the leads 3 need not necessarily be arranged on the major surface of the semiconductor chip 2, and some of the inner lead parts 3A of the leads 3 may be arranged near the semiconductor chip 2.

The present invention is not limited in its application to TSOPs, but is applicable to semiconductor IC packages of the LOC construction and semiconductor IC packages provided with LSI circuits other than DRAMs, such as LSI storage devices, microcomputers and logic LSI circuits.

According to the present invention, the inner lead parts of the leads are bonded to the major surface of the semiconductor chip only by the adhesive layer without interposing any insulating tape between the inner lead parts of the leads and the major surface of the semiconductor chip and, therefore, the thickness of the semiconductor device can reduced by a value corresponding to the thickness of an insulating tape.

According to the present invention, the number of parts can be reduced and the manufacturing cost can be reduced accordingly because the semiconductor device does not need any insulating tape.

According to the present invention, the semiconductor device has an improved resistance against cracking because the relatively hygroscopic insulating tape is omitted.

According to the present invention, the power supply leads are extended close to or set in close contact with the major surface of the semiconductor chip, and the signal leads are spaced apart from the major surface of the semiconductor chip to increase stray capacitance (parasitic capacitance) given by the power supply leads and to reduce stray capacitance given by the signal leads. Accordingly, the fluctuation of the supply voltage can be reduced and signals can be transmitted at a high signal transmission speed.

According to the present invention, bends are formed in the busbar leads by bending parts of the busbar leads in a plane parallel to the major surface of the semiconductor chip to absorb stress induced in the adhesive layer by the difference in coefficient of thermal expansion between the leads and the semiconductor chip by the distortion of the busbar leads. Accordingly, the adhesive layer is able to bond the leads to the semiconductor chip with improved reliability when sealing semiconductor chips of a large area and high-power semiconductor chips in packages.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A semiconductor device fabricating method comprising the steps of:
    (a) forming a lead frame having a power lead extended along a direction in which bonding pads of a semiconductor chip to be supported on one surface thereof are arranged and having depressed portion depressed toward a major surface of the semiconductor chip, and signal lead having an end part to be spaced apart from the major surface of the semiconductor chip;
    (b) putting the semiconductor chip on the lead frame with an adhesive layer interposed between the depressed portion of the power lead and the major surface of the semiconductor chip to support the semiconductor chip fixedly on a surface of the lead frame;
    (c) electrically connecting the power lead and the signal lead of the lead frame to the bonding pads formed on the major surface of the semiconductor chip by a bonding wire; and
    (d) sealing the semiconductor chip in a package body.

2. A method of manufacturing a semiconductor device, comprising the steps of:
    (a) providing a semiconductor chip having a major surface in which an integrated circuit and on which bonding pads are formed;
    (b) providing a lead frame having power supply leads and signal leads, said power supply leads each having an inner lead and an outer lead which is continuously formed with said inner lead, said signal leads each having an inner lead and an outer lead which is continuously formed with said inner lead of the signal lead, each of said inner leads of said power supply leads being bent to have a part which is disposed at a relatively lower level than said inner leads of said signal leads;
    (c) attaching said lead frame to said semiconductor chip in such a manner that said parts of said inner leads of said power supply leads are fixed to said major surface of said semiconductor chip and parts of said inner leads of said signal leads are at original positions disposed over and spaced from said major surface of said semiconductor chip in a thickness direction of said semiconductor chip;
    (d) connecting said bonding pads of said semiconductor chip with said parts of said inner leads of said signal leads by bonding wires in the condition that said parts of said inner leads of said signal leads are pressed down on said major surface of said semiconductor chip by a clamp tool;
    (e) after the step (d), returning said inner leads of said signal leads to their original positions by releasing said parts of said inner leads of said signal leads from said clamp tool, whereby said parts of said inner leads of said signal leads are spaced from said major surface of said semiconductor chip; and (f) after the step (e), sealing said semiconductor chip, said inner leads of said power supply leads, said inner leads of said signal leads and said bonding wires by a resin, a part of said resin being in a space between said major surface of said semiconductor chip and said parts of said inner leads of said signal leads.

3. A method of manufacturing the semiconductor device according to claim 1, wherein said parts of said inner leads of said power supply leads at the relatively lower level are respectively bonded to said major surface of said semiconductor chip by an adhesive layer.

4. A method of manufacturing the semiconductor device according to claim 3, wherein said adhesive layer is made of a resin material without a base insulating tape.

5. A method of manufacturing the semiconductor device according to claim 1, wherein said outer leads of said signal leads and said outer leads of said power supply leads protrude outwardly from said sealing resin at a substantially same level with respect to said major surface of said semiconductor chip in said thickness direction of said semiconductor chip.

6. A method of manufacturing the semiconductor device according to claim 1, wherein said inner leads of said signal leads are returned to their original positions by resilience of said lead frame in the step (e).

7. A method of manufacturing the semiconductor device according to claim 1, wherein the step (d) includes a step of connecting said bonding pads of said semiconductor chip with said parts of said inner leads of said power supply leads at the relatively lower level by bonding wires.

8. A method of manufacturing the semiconductor device according to claim 1, wherein, after the step (f), further comprising the step of eliminating unused portions of said lead frame and forming said outer leads of said power supply leads and said signal leads in a shape.

\* \* \* \* \*